United States Patent [19]

Janesick

[11] Patent Number: 5,365,092
[45] Date of Patent: Nov. 15, 1994

[54] FRONTSIDE ILLUMINATED CHARGE-COUPLED DEVICE WITH HIGH SENSITIVITY TO THE BLUE, ULTRAVIOLET AND SOFT X-RAY SPECTRAL RANGE

[75] Inventor: James R. Janesick, La Canada, Calif.

[73] Assignee: California Institute of Technology, Pasadena, Calif.

[21] Appl. No.: 17,423

[22] Filed: Feb. 8, 1993

[51] Int. Cl.$^5$ .................... H01L 29/78; H01L 27/14; H01L 31/00
[52] U.S. Cl. .................... 257/232; 257/236; 257/241; 257/250
[58] Field of Search ............... 257/232, 236, 247, 249, 257/250

[56] References Cited

U.S. PATENT DOCUMENTS 5,005,063  4/1991  Janesick ............................. 257/231

OTHER PUBLICATIONS

History and Advancements of Large Area Array Scientific CCD Imagers by James Janesick, Tom Elliott, Astronomical Society of Pacific Conference Series '91, Tucson, Ariz.

Primary Examiner—Ngan Van Ngo
Attorney, Agent, or Firm—Leonard Tachner

[57] ABSTRACT

A CCD which is designed and processed so that most of each pixel is covered only with an ultra-thin gate electrode so that the CCD can be frontside illuminated and still achieve good sensitivity in the ultra-violet and soft x-ray spectral range. More specifically, in the present invention, the usual three gate structure and corresponding polysilicon layers 1, 2 and 3 of conventional thickness are reduced in width and supplemented by a fourth ultra-thin layer of polysilicon dubbed herein, poly 4, that is deposited over the entire array. This fourth layer, poly 4, makes contact with poly 3, so that when poly 3 is driven, it also drives poly 4, thus allowing charge to collect and transfer as in a normal three phase CCD. However, because the deposition thickness of the poly 4 layer is on the order of 400 Angsttoms, as opposed to conventional thicknesses of 2000 to 5000 Angsttoms, poly 4 is essentially transparent to photons and thereby allows achievement of high quantum efficiency.

11 Claims, 5 Drawing Sheets

FRONTSIDE ILLUMINATED CHARGE-COUPLED DEVICE WITH HIGH SENSITIVITY TO THE BLUE, ULTRAVIOLET AND SOFT X-RAY SPECTRAL RANGE

ORIGIN OF INVENTION

The invention described herein was made in the performance of work under a NASA contract, and is subject to the provisions of Public Law 96-517 (35 USC 202) in which the Contractor has elected to retain title.

TECHNICAL FIELD

The present invention relates generally to the field of charge-coupled devices (CCDs) and more specifically, to a charge-coupled device having a fourth-level, ultra-thin, polysilicon layer to minimize frontside gate structures to allow photons to enter the photosensitive region and thus provide high sensitivity in the spectral range including blue, ultraviolet and X-ray.

BACKGROUND ART

Although the original concept of the CCD was as a memory device, it became immediately clear to a large number of workers in the semiconductor field that the CCD had potential uses that ranged far wider than simple memory applications. During the past two decades, the primary goal of CCD manufacturers has been to develop CCD sensors to replace tube type sensors (e.g., vidicon tube). The emphasis has been on realizing the CCD's advantages in size, weight, low-power consumption, ultra-low-noise, linearity, dynamic range, photometric accuracy, broad spectral response, geometric stability, reliability and durability, while attempting to match tube characteristics in format, frame rate, cosmetic quality, and cost. As a consequence, most home video cameras are now based on CCD sensors where only a few years ago tube imagers were used. Photographic film is rapidly taking a back seat to the new sensor where solid state color CCD still cameras (e.g. 35 mm) are now commercially available (e.g., Cannon). Although relatively expensive, by the end of the century a low-cost color "instamatic" CCD type camera is expected.

Astronomers, with their fundamental interest in the detection of photons from far away places, were perhaps the first to recognize the potential of the CCD for high quality scientific imaging. In comparison to photographic film and SEC vidicon tubes already in use, CCDs offered several benefits to the astronomer. In 1973, workers at the Jet Propulsion Laboratory initiated a program to develop high performance large area array CCDs, designed for space-borne navigation and imaging instruments.

Within a few years the CCD became the sensor of choice at all major observatories (with the possible exceptions of Schmidt telescopes like the 48-inch Mr. Palomar telescope that utilize large photographic plates). Also CCDs utilized at small observatories could participate in and produce new science that at one time could only be generated by larger telescopes. With a sensitivity of 100 times faster than film, it was clear that more data could be produced in a shorter period of time using a CCD. The new sensor immediately set new records in seeing the most distant and dimmest objects in the universe, objects that were invisible to film and tube type detectors before.

Quantum efficiency (QE) performance has varied widely among CCD manufacturers and is the most inconsistent parameter of all CCD performance characteristics. The primary goal of CCD manufacturers has therefore been to develop a mature QE technology to achieve high, stable and consistent performance.

This property of the CCD determines the sensitivity of the device to photons incident upon it, and of course, is a very important parameter in seeing very faint objects. Quantum efficiency basically measures photon loss and includes reflection loss at the surface of the sensor, loss by the absorption in the gate electrodes, loss in the gate insulator, loss of carriers via recombination in the silicon substrate, and for the near IR and X-ray radiation, lack of sufficient photon absorption in the material on which the CCD is built. Several design and process approaches have been used to minimize these losses for the CCD.

In it's early development it was discovered that the CCD could achieve high QE over a very broad spectral range including the near IR (7000–11,000 Å), the visible (4000–7000 Å), the UV (1000–4000 Å), the extreme UV (100–1000 Å) and the soft X-ray (1–100 Å). Such performance was first demonstrated by the thinned backside illuminated TI 3PCCD. Frontside illumination of the T1 3PCCD and other similar devices were limited to a small spectral range (the near IR, visible, and some of the X-ray spectrum). Coverage was limited due to photon absorption in the relatively thick gate electrodes. For example, at a wavelength of 4000 Å, the absorption depth of a photon is only 2000 Å in silicon (absorption depth is that distance where 63% of the incoming photons are absorbed, i.e., $\exp^{-1}$). Because the thickness of poly silicon gates is typically thicker than this (5000 Å in the case of the TI 3PCCD) low QE was exhibited (a few percent at 4000 Å). The gate absorption problem worsens in the UV and peaks mid-range at 2500 Å where the absorption length is only 25 A (a few atomic layers) resulting in zero QE for the CCD. Reflection of photons from the surface is also the greatest at this wavelength, approximately 70%. Shortward of 2500 Å, absorption and reflection loss decrease and the top layers of the CCD become less influential on QE. However, the frontside illuminated CCD only begins to show life in the soft x-ray (shortward of approximately 25 Å) where photons can once again penetrate through the gate electrodes into the active silicon.

At either end of QE response, in the near IR (11,000 Å) and soft X-ray (1 Å), the CCD looks transparent to incoming photons because the absorption length of the photon is much greater than the active thickness of the device. For example, a 1.06-micron photon penetrates several hundred microns in silicon resulting in a QE of a few tenths of a percent. A simular cut-off response is exhibited at the end of the soft x-ray regime (i.e., 1 Å or 10 keV). QE performance can be improved in these spectral regions by making the active cross-section of the device thicker. Deep depletion or high resistivity CCDs are being fabricated for this purpose. These sensors are fabricated on high resistivity silicon which deepens the pixel potential wells thereby collecting photogenerated charge made deep in the CCD. For example, conventional CCDs employ 10 to 50 ohm-cm resistivity silicon resulting in depletion depths not more than 10-microns. Deep depletion CCDs on the other hand employ resistivities of 1000 ohm-cm or greater resulting in depths of tens of microns with a proportional increase in QE in the IR and soft x-ray.

Consequently, thinning and backside illuminating the CCD will deliver the highest QE possible. Thinning a CCD is a simple procedure to perform. In fabricating the Space Telescope CCD the following thinning recipe was used at TI. Following wafer fabrication and die separation, a chip was mounted frontside down onto a 3-inch sapphire wafer. Then the active area on the backside of the chip was carefully masked using a hard wax. The sapphire disc and CCD were then mounted onto a teflon disc about the size of a hockey puck. The puck was then lowered and immersed into a plastic drum containing acid etching solutions (hydrofluoric, nitric, and acetic acids) which in combination rapidly etches silicon (the sapphire wafer, wax, and teflon puck are immune to the acids). The drum, tilted at 45 degrees, was then rotated slowly at 30 rpm rate reversing directions every minute or so. The teflon puck freely rotated in the bottom of the drum in an opposite direction to drum rotation. The chip was thinned from an initial thickness of about 300-microns to a thickness of 8-microns in about 60 minutes. Thinning essentially stopped when the epitaxial interface was reached because the etch rate of silicon signficantly diminishes when low-doped, high resistivity epitaxial material is encountered. For the TI 3PCCD this rate was approximately 100 times slower, and therefore, the epitaxial interface was used as an etch stop. After thinning, the CCD was carefully removed from the drum, puck, and sapphire disc and thoroughly washed before mounting in a package.

Thinning and subsequent packaging at TI was a delicate process to perform and took a heavy toll on sensor yield initially where many good CCD imagers were lost. Nearly 1 decade of thinning work was performed at Texas Instruments (by a single individual) for the Space Telescope effort. Thinning yields were perfected to the level where only a few sensors were lost to the process.

Two major problems were associated with the thinning technique implemented at TI. First, as the CCD was thinned, eddy currents set-up in the thinning drum preferentially etched the corners of the CCD. The corners of the CCDs are about 1-micron thinner than the center of the device due to this problem. This charactersitic led to nonuniform QE sensitivity across the detector (for some CCDs this amounted to global QE nonuniformities of greater than 500%). Second, mechanical stresses developed about the active area causing the thinned membrane to warp typically in a concave manner (the warp was specified by JPL engineers as the potato chip factor). For some thinned devices the flatness varied as much as 100-microns due to this problem. This trait made it difficult to focus an image onto the CCD when employed in fast optical systems. Custom corrective optics were sometimes positioned in front of the CCD to correct the aberration (telescopes faster than f/5 required such fixes). To make matters worse, the shape of the membrane would change and buckle as the device was cooled making the surface a moving target.

Fortunately, thinning problems experienced at TI for the most part have been eliminated today. For example, Tektronix supports and backs the frontside of the CCD with a thick ceramic header before thinning is performed. This method guarantees that the CCD will remain flat after thinning. Also Tektronix thins the entire silicon wafer resulting in uniform thickness and QE response for individual CCDs. It is interesting to note that after the Tektronix device is thinned, it must be electrically bonded to the package. To accomplish this the sensor is spot thinned beneath the bond pads coming in from the backside of the device (necessary since the frontside is covered with a ceramic header). The CCD is then bonded using the "backside" of the bond pad—a clever trick to implement in practice.

To complete the thinning task the backside surface must be treated or very low QE will be exhibited, considerably less than frontside QE. Immediately after thinning, silicon oxidizes form a native oxide layer of approximately 20 Å thickness. Through a very complex process the native oxide growth causes the surface to charge positively. The positive voltage induced in the oxide layer creates a backside depletion region and a corresponding backside potential well in the silicon that attracts and collects photogenerated electrons. The signal electrons collected eventually recombine at the surface and do not reach the frontside. In addition to this problem, the native oxide surface is very susceptible to charging effects. For example, signal charge will get trapped at the surface, negating the positive oxide charge causing the bakside well to shrink in size. This phenomenon leads to an increase in QE. Over time, depending on operating temperature, the trapped charge will recombine lowering the QE back to its original level. The native oxide surface is also very sensitive to environmental changes (humidity, smog, etc.) resulting in a QE that is unpredictable from day to day. Quantum efficiency hysterisis or QEH is a CCD term used to describe such behavior in CCDs. QEH was observed for all eight Space Telescope CCDs. Unfortunately the QEH problem was not discoverd until the instrument was assembled and tested. The dilema severely crippled the project because QE varied more than 500% at selected wavelengths,and exposure periods (such stability is to be compared to a 1% long term photometric stability requirement specified by the Space Telescope science team).

To achieve high and stable QE the backside of the CCD must be negatively charged to drive signal electrons towards the front surface where they can be collected, transferred and detected. Four backside CCD treatment approaches are currently utilized to provide the necessary backside repelling fields for high and stable QE performance. The first method, referred to as backside charging, involves supplying free electrons on the native oxide surface. One method employed to accomplish the charging effect is to use an intense UV light flood (1800–2500 Å). The UV photons pass through the native oxide layer and are immediately absorbed by the silicon a few angsttoms from the Si-SiO$_2$ interface. Some of the photogenerated electrons created by the UV photons, have sufficient energy to escape to the back surface where they can reside creating a small surface voltage (a few tenths of a volt). The negative potential in turn attracts and accumulates a thin layer of holes (approximately 200 Å depending on the doping of the epitaxial material) at the Si-SiO$_2$ interface. The gradient of holes generates an intense electric field in the silicon as high as $10^5$ V$^2$/cm when the CCD is fully charged. If the field strength is high enough, an internal QE of 100% can be achieved at all wavelengths, an important backside state referred to as the QE-pinned condition. For some QE-pinned CCDs, the backside fields are so strong that an internal gain has been observed which generates multiple e-h pairs for each interacting photon in the UV.

Other techniques have been invented to backside charge the CCD such as corona charging (a high voltage discharge in front of the sensor); and gas charging a method that briefly exposes the CCD to an oxidizing gas such as chlorine or nitrogen monoxide gases that both promote negative surface charge buildup. The eight Space Telescope CCDs use a UV light flood while in earth orbit employing the sun as the source of UV light. The sun light is brought into the side of the instrument at right angles to the axis of the main mirror by a piece of hardware referred to as the light pipe. The light pipe was added to the cameras before launch to fix the QEH problem at a cost of 5 million dollars.

The main drawback to backside charging is that the charge induced will not persist for long periods of time unless the sensor is kept cold (it has been shown that sensors remain charged indefinitely at −95 degrees C.). To circumvent this problem, another backside treatment technique referred to as the flash gate can be used to permanently generate negative charge. This method is based on depositing a monolayer (i.e., 1-atom thick on average) of high work function metal onto the backside of the CCD. The metal causes silicon electrons to "tunnel" through the native oxide layer and generate a surface potential equal to the work function difference between the metal gate and silicon (a few tenths of volt). Gold, platinum, iridium, and nickel have been used to achieve the QE-pinned condition. Another important advantage of the flash gate over backside charging is that anti-reflection coatings can be deposited on top of the gate to reduce reflection loss. This backside configuration has yielded very high QEs (i.e., greater than 90% in the visible spectrum range for the CCD).

Unfortunately the flash gate, like backside charging, is also limited and fails to maintain the QE-pinned state under high vacuum conditions. Through a complex surface process not fully understood, the vacuum environment promotes additional positive charge buildup in the native oxide layer, negating the negative charge generated by the flash gate. This collapses the internal fields in the silicon resulting in a lower QE (the device becomes unpinned). To bypass this difficulty the biased flash gate was proposed. As the name implies, the backside metal gate is biased slightly negative to compensate for the positive charge induced under vacuum conditions. Because the potential on the gate can be controlled externally, the user can control the QE of the detector. The bias also acts as an electronic shutter. For instance, when positively biased, a backside depletion well forms and charge is swept towards the backside and lost as though a shutter was closed. When biased negatively, carriers are forced to the frontside resulting in high QE. Of course, the electronic shutter control described only works for wavelengths where the photon absorption depth is less than the backside potential well depth induced (i.e., applicable for blue and UV wavelengths).

Although the original biased flash gate was based on a platinum gate, other groups (e.g., Lick Observatory in collaboration with EG & G Reticon) are now using a gate material made of indium tin oxide (ITO). ITO has an interesting characteristic in that it is conductive but transparent. The Lick group uses about 80 Å of ITO deposited on a base of Si-O which acts as an insulator. High QE's have been achieved with the ITO structure when biased negatively.

The fourth and most popular accumulation approach of CCD manufacturers is to dope the backside of the CCD with a very concentrated but ultra-thin layer of boron. Some CCD groups using this method are Sarnoff Laboratory, Lincoln Laboratory, Thomson-CSF, and Tektronix. The boron implant provides a permanent hole layer that generates a similar field condition at the backside of the CCD as the three backside accumulation techniques discussed above. The approach is effective in obtaining high QEs in the visible and UV spectral ranges. For example, off-the-shelf Tektronix backside illuminated CCDs deliver QEs greater than 85% when anti-reflection coatings are also used (a simple silicon nitride layer has been successfully employed by Tektronix for this purpose). The UV response for the same detector exhibits-a UV QE as high as 35% at 3000 Å.

The backside of the CCD can be doped in diverse ways depending on the processing scheme used. For example, Tektronix dopes the surface using a low-energy boron implant beam. When implanting with energetic boron atoms, radiation damage is induced at the backside because silicon atoms are displaced from the lattice structure. These displacements from trapping and recombination centers for signal electrons leading to poor QE. Therefore, to "activate" the dopant and anneal the damage, the surface of the CCD must be heated to a high temperature. Upon heating, the vacancies recombine with interstitials restoring the lattice structure. The heating process must be selective for the device must not get too hot or the aluminum bus lines and bond pads on the frontside of the CCD will evaporate. Only the immediate backside surface must be heated. This has been accomplished by using a scanning high energy pulsed laser beam or rapid surface annealers.

Sarnoff Laboratory follows a backside accumulation technique developed by RCA two decades ago. Unlike TI, Sarnoff thins the entire wafer before the aluminum bus lines and bond pads are deposited. A thick border of silicon around the perimeter of the wafer is left for handling purposes to finish the device. After thinning, the wafers receive a boron implant to provide the necessary accumulation layer as described above. The wafers are then sent back to the process line where they're placed into a furnace and heated to activate the boron implant. After annealing, the backside of the wafers are backed with a thick supporting glass. The CCD wafers then move on for aluminum deposition and later are diced, bonded and packaged. As demonstrated by Sarnoff, the technique also achieves high QE at the same levels as Tektronix when anti-reflection coatings are also employed. For extended UV response, the glass support used by Sarnoff must be thinned away to expose the bare silicon surface, a process not required by Tektronix because the supporting structure is located on the frontside of the CCD.

Although the backside boron implant technique has demonstrated high QEs in the visible and UV, the QE-pinned state (i.e., 100% internal QE) has not been fully realized over the entire photon spectrum. QE-pinned performance is crucial for radiation imaging spectrometers where the charge generated must be totally collected without loss and measured to assess incident energy. Backside charging has demonstrated good performance in this area promoting strong internal electric fields with a minimum backside dead layer.

From the discussion above it can be seen that backside processing can significantly add to the cost of fabricating a CCD. An alternative and relatively straightforward approach used to avoid thinning and accumulation is to vacuum deposit an organic phosphor coating on the frontside on the CCD to convert incident UV photons into longer wavelength photons. The secondary photons produced penetrate beyond the gate electrodes into the active silicon achieving relatively good QE perormance. Several different types of phosphors are being used. For example, CCDs have been coated with a coronene phosphor that absorbs UV photons shortward of 3900 Å and emits new photons at 5200 Å. The coronene layer has one significant draw-back in that a "QE notch" is exhibited between 3900 and 4200 Å, wavelengths where coronene is not sensitive.

The QE notch exhibited by coronene can be eliminated by using a different phosphor coating referred to as lumigen (a phosphor coating first developed by Photometrics). Curiously, lumigen is the same constituent used in commercial yellow phosphorescence "highlighting" pens. The lumigen layer is thermally vacuum deposited at $10^{-6}$ torr with the CCD at 80 degrees C. to a thickness of approximately 6800 Å. Lumigen absorbs throughout the UV and some of the EUV (i.e., 500 to 4200 Å) achieving a 100% quantum yield emitting yellow/green photons at approximately 5300 Å. QE's of 12-16% have been achieved by the new lumigen coated frontside CCDs that cover a spectral range of 1200 to 4200 Å. Lumigen is transparent in the visible and near IR and does not significantly influence QE performance is this region (QE is actually higher since lumigen does act as an anti-reflection coating). Thicker layers of lumigen (or coronene) will extend the sensor's response further into the EUV (i.e., shortward of 500 Å).

The main difficulty with phosphor coatings is that they have a tendency to evaporate under high vacuum conditions. For example, at $10^{-6}$ tort and an operating temperature above 60 degrees C., lumigen will slowly evaporate from the CCD. The CPAF/Cassini CCD will circumvent this problem by packaging the coated sensor in a hermetically sealed package and back-filling with an inert argon gas to a half atmosphere. This configuration in conjunction with a quartz window will achieve a flat QE of 15% from 1800 to 4200 Å under space vacuum conditions (approximately $10^{-6}$ tort) and an operating temperature as high as 100 degrees C. New CCDs have been sealed with a magnesium fluoride package window to achieve the same QE level but to Lyman-alpha (1216 A).

Two other problems with phosphor coatings should also be noted. First, coated frontside illuminated CCDs exhibit a slight reduction in MTF response in the UV. This characteristic results from the scattering of light generated by the lumigen layer from the target pixel into neighboring pixels. Therefore, to minimize light scattering, the frontside top layers (i.e., poly gates and oxide overcoat layers) should be fabricated as thin as possible to keep the phosphor in close proximity to the active silicon. This particular problem is not as acute for backside illuminated CCDs because the phosphor is essentially in direct contact with the silicon (separated by a native oxide layer). Second, phosphor coatings only emit one visible photon per interacting photon and therefore, multiple e-h pair generation is not possible when phosphors are used. Phosphor coated devices, for example, are not used in CCD radiation imaging spectrometers.

Different CCD technologies have been invented to bypass thinning and phosphor coatings to achieve relatively high frontside QE in the UV. Virtual-phase technology (VPCCD) has been successfully implemented at Texas Instruments for this purpose. In virtual-phase a four-step potential profile within each pixel is implemented with ion-implantation and a single overlying gate clocks two of these potential steps to effect charge transfer (the region of the pixel which is clocked is referred to as the clocked region and the region with the poly gate is referred to as the virtual region). Since there is only one poly gate layer that overlies half of each pixel, it is possible to achieve significant short-wavelength response with frontside illumination. For example, the Galileo VPCCD achieves a 25% QE at a wavelength of 4000 Å, about a factor of five times higher than a Loral three-phase CCD. The virtual-phase device provides reasonable UV QE down to approximately 1800 Å at which point the gate oxide and protective "scratch" oxide layer become opaque causing the QE to drop abruptly. The thickness of the oxide layers can be minimized in the virtual region to obtain improved UV and low energy X-ray response as accomplished by the SXT CCD. For the SXT CCD the oxide thickness is less than 3000 Å allowing X-ray energies of 500 eV and greater to be detected.

In many respects VPCCDs are more difficult to fabricate than multi-phase sensors. For example, fabricating a TI VPCCD requires at least 14 mask sets in patterning the levels for the device. In comparison, a simple four-phase CCD requires half that number. In addition, the various implants employed in a virtual-phase pixel must be critically aligned with sub-micron accuracy where multi-phase pixels do not reqire such precision. Currently TIJ is the only manufacturer that knows how to make virtual-phase CCDs.

In general, VPCCDs when utilized in low-signal applications, exhibit relatively poor CTE performance compared to multi-phase CCDs. The difficulty has been traced to spurious potential pockets which trap charge in the signal channel because of improper potential well shape within the pixel defined by the implants. As mentioned above, alignment of the implants is crucial for this technology to work and small misalignments often create potential pockets (or bumps) which trap charge. This problem was in part responsible for the need to fabricate 39 Lots of VPCCDs for the Galileo effort to obtain the single CCD unit now in space. Single clock operation is an important feature that virtual-phase technology offers. Unfortunately, the inflexibility of this virtue has often proved to be a disadvantage for low-signal applications. Many CTE problems associated with multi-phase CCDs have been solved by manipulating the clock phases to collapse CTE pockets located in the signal channel. Many of the potential wells in a virtual-phase pixel are defined by implants not external gates, so the user cannot control them to achieve optimum CTE.

Open pinned-phase (OPP) CCD technology is similar to the virtual-phase CCD. An OPP CCD is constructed exactly as a three-phase CCD except that the third level of poly is not deposited leaving a portion of the pixel open to UV photons. In place of the third phase, two implants are incorporated. The first implant adds more phosphorus to the buried channel increasing the channel potential for signal charge to collect. The second implant, a concentrated but very shallow implant of boron, pins the surface potential at the $Si-SiO_2$ to substrate potential (the conductive layer is internally connected to the channel stops which are connected to ground). This implant is important to assure that the potential well benearth the open regions remains fixed as phases 1 and 2 that neighbor the open-phase are clocked. Both implants are self-aligned by poly levels one and two. An OPP pixel is typically designed so that phases 1 and 2 occupy half the pixel, whereas the open-phase occupies the other half. Other arrangements are possible depending on full well and QE performance desired. In OPP CCD technology only the vertical registers employ the open phase and two extra implants. The horizontal registers always include the third poly level because QE performance for this register is not important.

There is still an ongoing need for a CCD technology wherein high QE at blue, UV and x-ray spectral ranges is achieved without requiring backside thinning and illumination, phosphor coatings, high-cost fabrication techniques, or high resistance gate structures.

STATEMENT OF THE INVENTION

The present invention solves the aforementioned disadvantages of the prior art by providing a CCD which is designed and processed so that most of each pixel is covered only with an ultra-thin gate electrode so that the CCD can be frontside illuminated and still achieve good sensitivity in the ultra-violet and soft x-ray spectral range. More specifically, in the present invention, the usual three gate structure and corresponding polysilicon layers 1, 2 and 3 of conventional thickness are reduced in width and supplemented by a fourth ultra-thin layer of polysilicon dubbed herein, poly 4, that is deposited over the entire array. This fourth layer, poly 4, makes contact with poly 3, so that when poly 3 is driven, it also drives poly 4, thus allowing charge to collect and transfer as in a normal three phase CCD. However, because the deposition thickness of the poly 4 layer is on the order of 400 Angsttoms, as opposed to conventional thicknesses of 2000 to 5000 Angsttoms, poly 4 is essentially transparent to photons and thereby allows achievement of high quantum efficiency without requiring the previously described prior art solutions such as backside thinning and illumination. The simple but yet highly innovative solution provided by the present invention to the previously described dilema of low quantum efficiency in the ultra-violet and soft x-ray spectral ranges, permits CCD fabrication with conventional processes and equipment, thus obviating the high cost penalties associated with such prior art solutions. Furthermore, the present invention obviates the requirement for the use of phosphorous coatings to increase quantum efficiency, but which suffer the previously described disadvantage of the evaporation, particularly in highly evacuated environments, such as spacecraft applications.

OBJECTS OF THE INVENTION

It is therefore a principal object of the present invention to provide a charge coupled device which provides high photo sensitivity in the spectral range including blue, ultra-violet and x-ray, as compared prior art CCDs and without requiring backside thinning and illumination or the use of phosphorus coatings.

It is an additional object of the present invention to provide a charge coupled device which provides high sensitivity to photons in the blue, ultra-violet and x-ray spectral regions by minimizing frontside gate structures allowing photons to enter the photo sensitive region of the CCD.

It is still an additional object of the present invention to provide a charge coupled device having high photo sensitivity in the spectral ranges including blue, ultra-violet and x-ray by providing a fourth ultra-thin polysilicon layer in addition to reducing the three levels of thick polysilicon gate structures which otherwise would yield poor sensitivity in such spectral ranges to incident photons.

It is still an additional object of the present invention to provide an improved CCD gate structure comprising first, second and third thick polysilicon layers of reduced geometrical dimensions and a fourth overlying ultra-thin gate layer which is in electrical contact with the third such polysilicon layer to provide a frontside gate structure which would permit access to the CCD sensitive areas by incident photons while still providing low resistivity gate performance, the thin gate layer being made of a material which is sufficiently conductive to transfer charge while being relatively transparent to wavelengths of light in at least the blue, ultra-violet and x-ray spectral range.

BRIEF DESCRIPTION OF THE DRAWINGS

The aforementioned objects and advantages of the present invention, as well as additional objects and advantages thereof will be more fully understood hereinafter as a result of a detailed description of a preferred embodiment when taken in conjunction with the following drawings in which:

FIG. 4, comprising

DETAILED DESCRIPTION OF A PREFERRED EMBODIMENT

Figure 1:
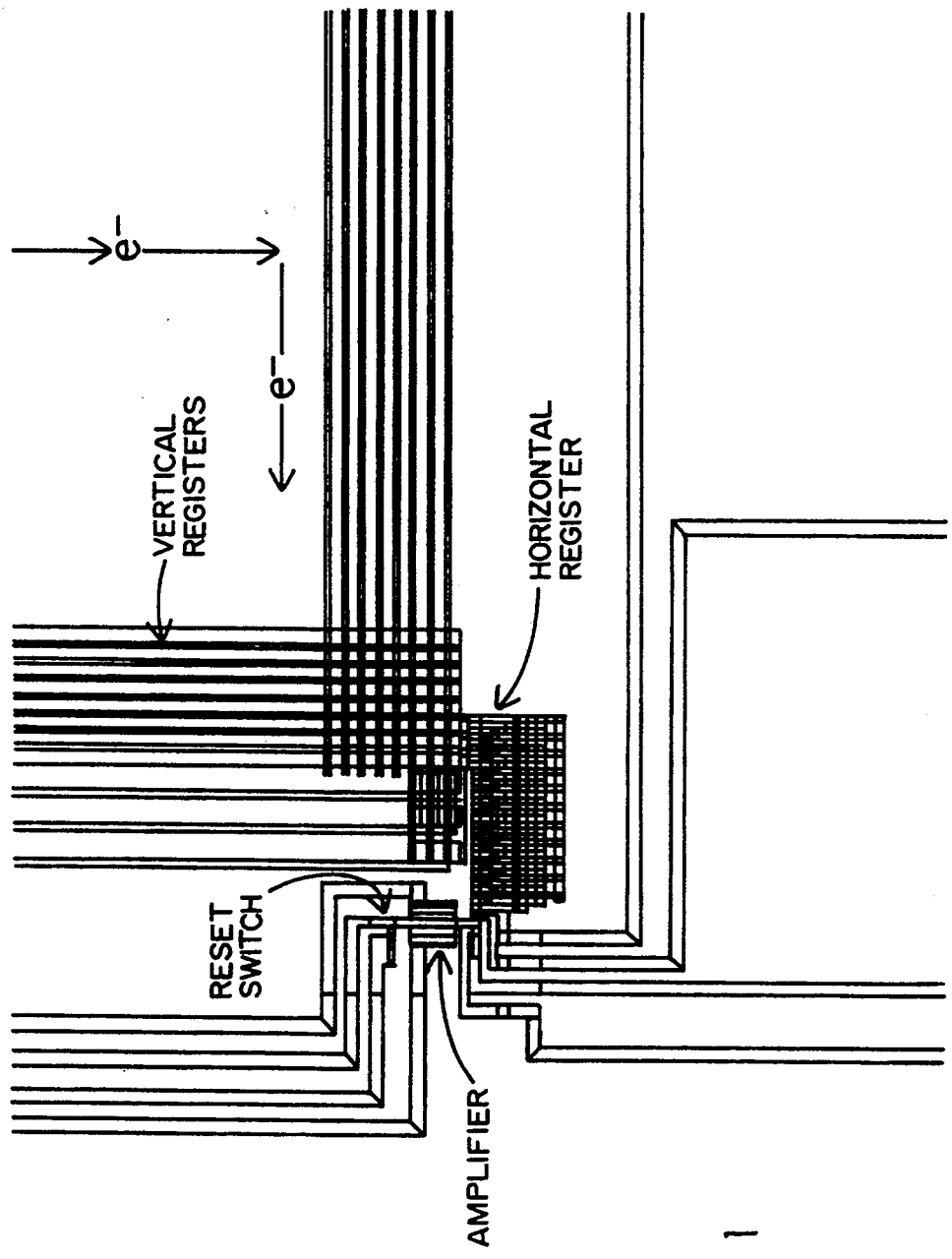
FIG. 1 is a magnified view of a corner of a CCD employing the present invention.

FIG. 1 is a magnified view of the lower left hand corner of a 1024×1024, 18-micron pixel CCD array. The amplifier and horizontal and vertical registers, along with a reset switch are shown. Also shown therein is the general direction of charge tranfer in the array as indicated by the arrowheads and the letter "e" with a negative superscript.

Figure 2:
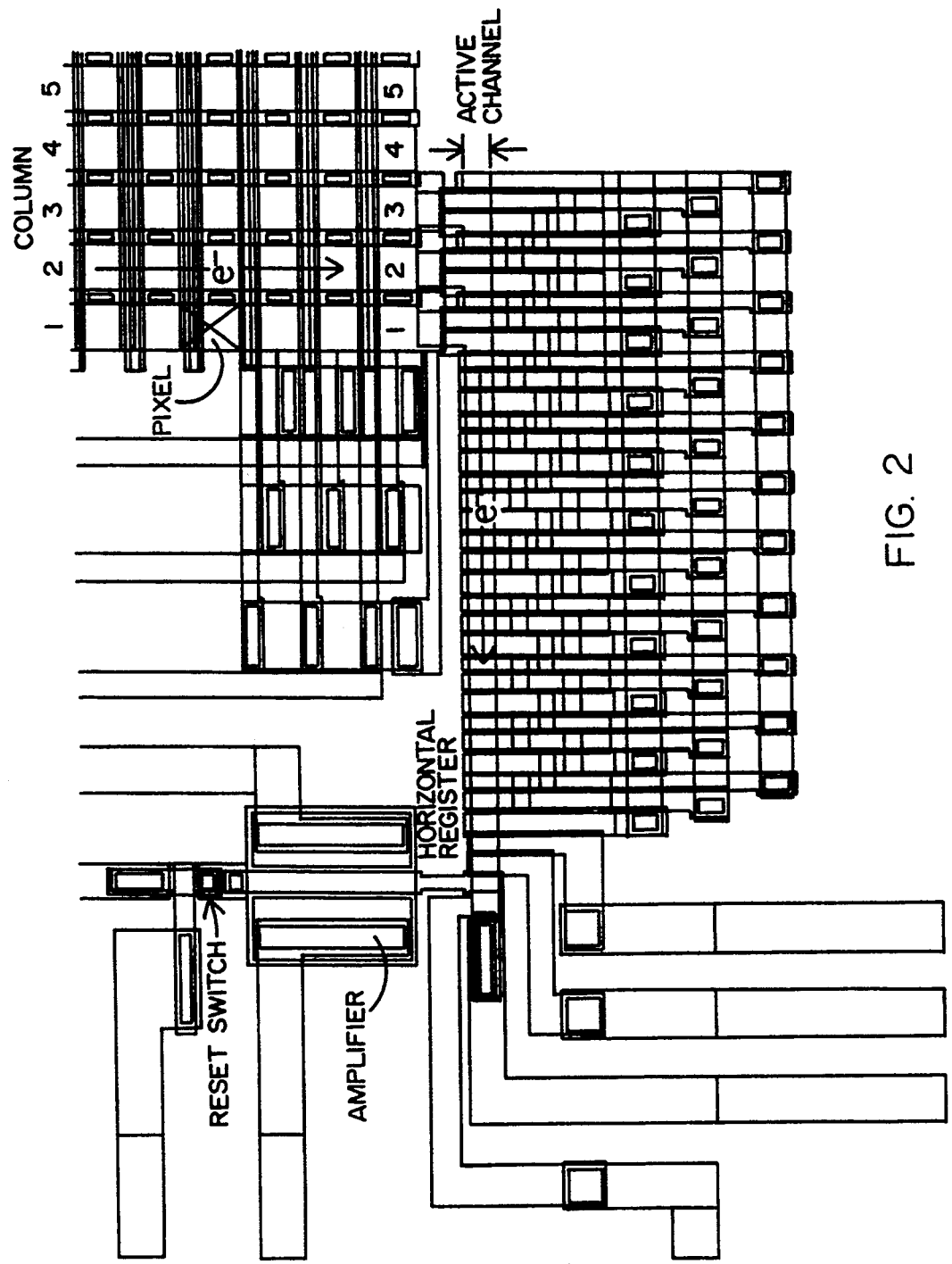
FIG. 2 is a magnified view of FIG. 1, showing a few pixels thereof.

FIG. 2 is a magnified view of FIG. 1 showing a few pixels of the array and corresponding column numbers also labelled 1 through 5. An exemplary individual pixel is identified with a large X in FIG. 2 along column 1.

Figure 3:
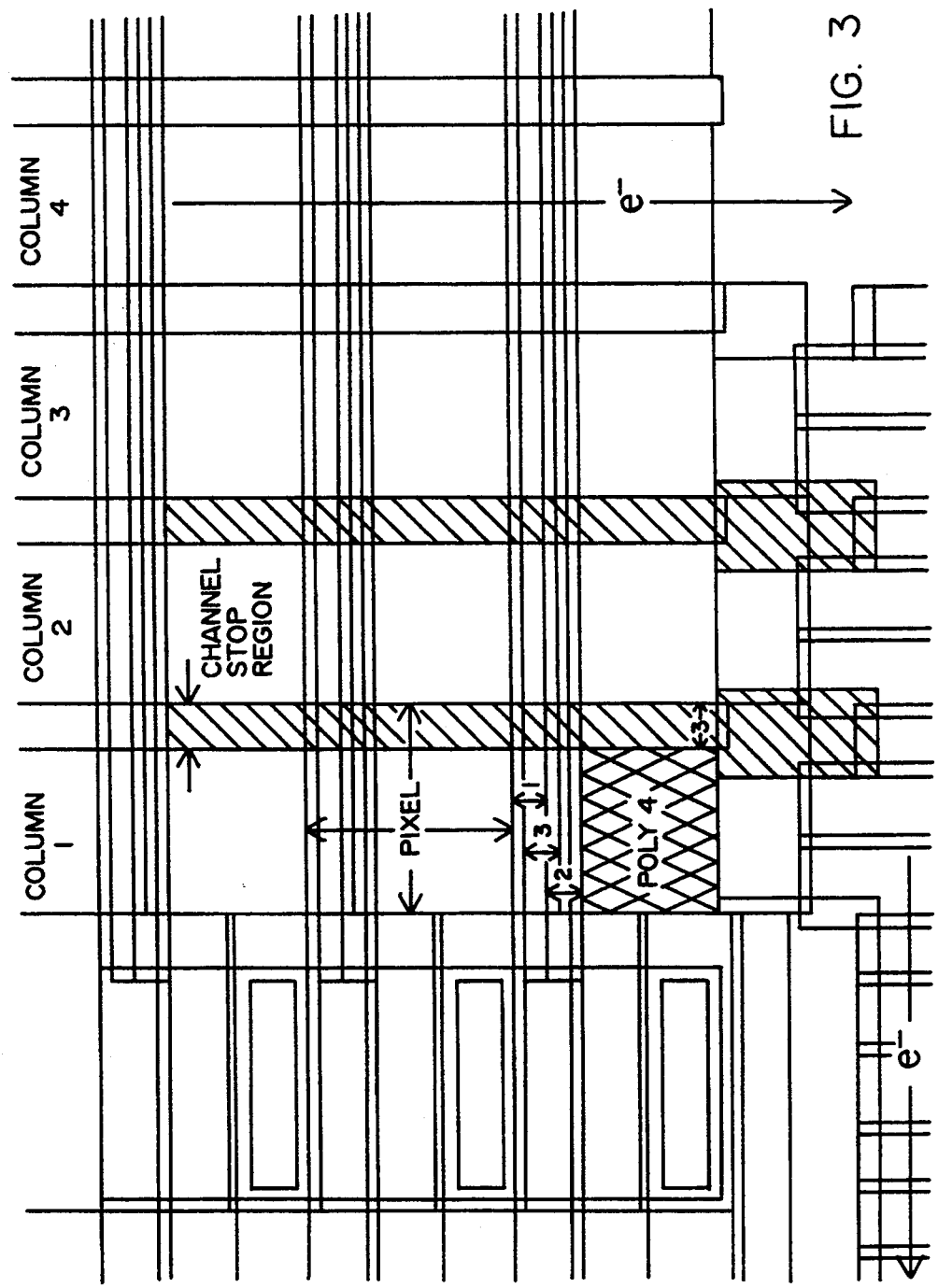
FIG. 3 is a magnified view of FIG. 2 in which individual pixels are clearly discernable, along with the deposition of the ultra-thin polysilicon layer 4 that is deposited over the entire array in accordance with the present invention.

FIG. 3 is a magnified view of FIG. 2. In this figure, the individual pixels are clearly discernable. Poly levels 1, 2 and 3 are shown. The thicknesses of these layers are typically 2000 Angstroms and their width is a reduced 3 microns. This thickness of 2000 Angsttoms is generally much too thick for soft x-ray and UV photons to pass through. However, because of their reduced width the layers occupy a small portion of the pixel. An ultra-thin layer of poly 4 is deposited over the entire array. Poly 4 makes contact with poly 3. Therefore, when poly 3 is driven, it also drives poly 4, thus allowing charge to collect and transfer as in a normal three phase CCD. The deposition thickness of the poly 4 layer can be varied to minimize front-side dead layer achieving high quantum efficiency. In the preferred embodiment illustrated herein, the thickness of the poly 4 layer is 400 Angsttoms. The size of each pixel, including phase 1, 2, and 3 thick polysilicon layers is 18 microns by 18 microns. Each thick polysilicon layer corresponding to phases 1, 2, and 3 is three microns wide and 2000 Angsttoms thick. The poly 4 or thin polysilicon fourth layer covers the entire photo sensitive region of the CCD array.

Figure 4A:
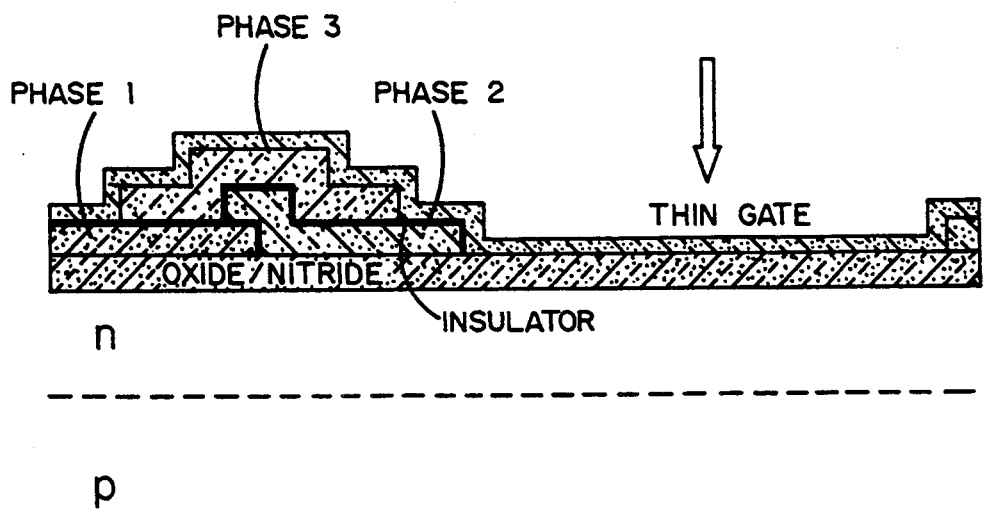
FIGS. 4(a) and 4(b), is a cross-sectional diagram of a single pixel region of a CCD employing the thin gate structure of the invention.
Figure 4B:
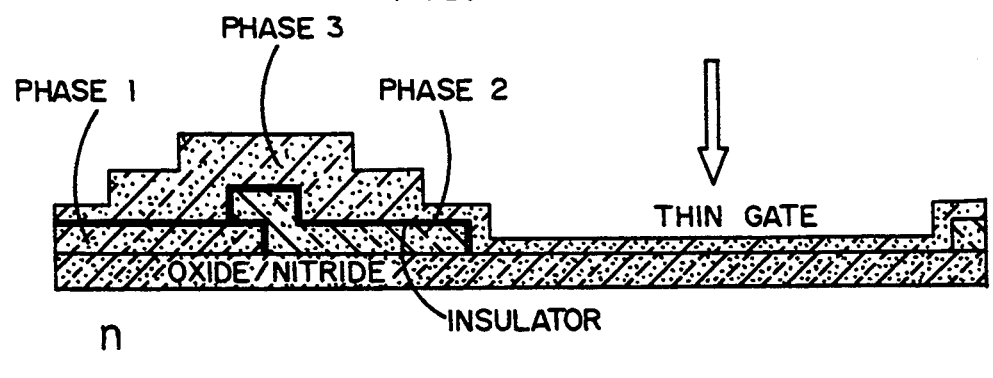

FIG. 4, comprising FIGS. 4(a) and 4(b), provides a cross-sectional view of the electrodes and shows the relationship between the thick polysilicon layers of phases 1 through 3 and the thin polysilicon fourth layer on a typical buried channel CCD silicon structure employing a silicon oxide/silicon nitride double insulator. Of course, in order to maintain independent bias voltages on the three individual phases provided by polysilicon layers 1, 2 and 3, each is separated from the other by an insulator layer. The fourth polysilicon layer In FIG. 4(a), the fourth silicon layer is shown as a distinct layer and in FIG. 4(b), the fourth silicon layer is shown as part of a thin layer extension of the phase 3 layer identified as "thin gate" in FIG. 4 is electrically isolated from phases 1 and 2, but is in electrical contact with phase 3 and thus may be thought of as a thin layer extension of the phase 3 polysilicon layer or as a separate and distinct fourth polysilicon layer, but in electrical contact with the third polysilicon layer.

Figure 5:
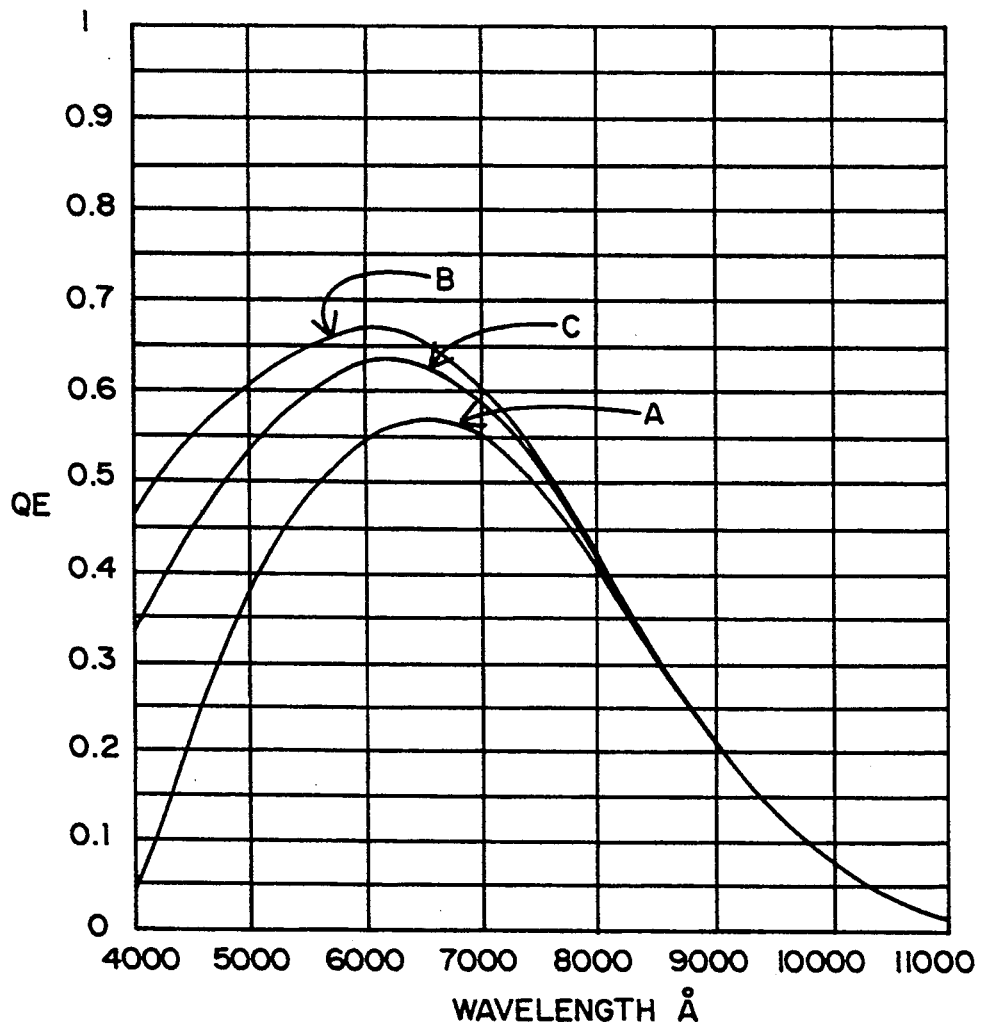
FIG. 5 is a graph of Quantum Efficiency of various gate thickness configurations in the wavelength of interest.

FIG. 5 is a graphical representation of theoretical performance curves of Quantum Efficiency vs. Wavelength between 4,000 and 11,000 Angsttoms. Curve A indicates the expected quantum efficiency using conventional three phase polysilicon layers each 5000 Angstroms thick. Curve B is the expected Quantum Efficiency if all gates were 400 Angsttoms thick and Curve C is the expected Quantum Efficiency where phases 1, 2, and 3 are 5,000 Angsttoms thick and a thin gate of 400 Angstroms is used in the manner shown in FIG. 4. The graph of FIG. 5 shows that even at the top end of the UV range, namely a wavelength of 4,000 Angsttoms, Quantum Efficiency is improved by a factor of approximately seven. Furthermore, because of the obvious difference in slope characteristics of the graph A, compared to graph C of FIG. 5, the improvement in Quantum Efficiency will even be more significant at lower wavelengths in the lower UV range, blue range and soft x-ray range. Further improvement is anticipated using an even thinner polysilicon fourth layer. Furthermore, other thin gate material such as a monolayer of platinum may be used for the thin gate.

Any material of sufficient conductivity to transfer charge, sufficient transparency to the wavelengths of interest and conducive to easy and available fabrication processes can serve as the thin gate material.

Having thus described an exemplary embodiment of the invention, what is claimed is:

1. In a charge-coupled device having a photo-sensitive area and a plurality of electrically isolated frontside gate structures for transferring charge packets by manipulating voltages applied to the gate structures; the improvement comprising:

an additional gate structure comprising a layer of conductive material sufficiently thin to be substantially transparent to photons at all wavelengths below 11,000 Angstroms;

said additional gate structure being in electrical contact with one of said gate structures of said plurality and overlying substantially the entire photo-sensitive area of said device;

said gate structures of said plurality being at least five times thicker than said additional gate structure and being reduced in width whereby the majority of photons incident on said photo-sensitive area need penetrate only said additional gate structure.

2. The improvement recited in claim 1 wherein said gate structures of said plurality occupy no more than one-third of the photo-sensitive area of said device.

3. The improvement recited in claim 1 wherein said additional gate structure is no more than 400 Angsttoms in thickness.

4. The improvement recited in claim 1 wherein the width of each said gate structure of said plurality is no more than one-sixth the width of said additional gate structure.

5. A photo-sensitive charge-coupled device comprising a plurality of electrically isolated gate structures for transferring charge packets by manipulating voltages applied to said gate structures; one of said gate structures having a thick portion and thin portion, said thin portion extending over the entire photo-sensitive region of said device, the width of the other said gate structures and said thick portion of said one gate structure being minimized to expose a majority of said photo-sensitive region to said thin portion, whereby a majority of photons incident on said photo-sensitive region of said device need only penetrate said thin portion.

6. The device recited in claim 5 wherein said thick portion and said other gate structures occupy no more than about one-third of the photo-sensitive region of said device.

7. The device recited in claim 5 wherein said thick portion is at least five times thicker than said thin portion.

8. The device recited in claim 5 wherein said thin portion is no more than about 400 Angstroms thick.

9. The device recited in claim 5 wherein said thin portion is at least four times wider than said thick portion.

10. The device recited in claim 5 wherein said thin portion is made of a material different from said thick portion.

11. A three-phase buried channel CCD comprising four gate structures, a first, second and third gate structure having a selected thickness and width and being in overlapping physical relation and being electrically insulated from each other, a fourth gate structure overlying substantially the entire surface area of said CCD and being in electrical contact with the third gate structure; the fourth gate structure being no more than one-fourth the thickness and being at least four times the width of the first, second and third gate structures whereby a majority of photons incident on said CCD need penetrate only said fourth gate structure.

* * * * *